(12) United States Patent
Mathur et al.

(10) Patent No.: US 8,863,057 B2
(45) Date of Patent: Oct. 14, 2014

(54) METHOD FOR SELECTIVELY MODELING NARROW-WIDTH STACKED DEVICE PERFORMANCE

(71) Applicants: Kaveri Mathur, Sunnyvale, CA (US); Sriraaman Sridharan, Sunnyvale, CA (US); Ciby Thuruthiyil, Fremont, CA (US)

(72) Inventors: Kaveri Mathur, Sunnyvale, CA (US); Sriraaman Sridharan, Sunnyvale, CA (US); Ciby Thuruthiyil, Fremont, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/671,226

(22) Filed: Nov. 7, 2012

(65) Prior Publication Data

US 2014/0129999 A1 May 8, 2014

(51) Int. Cl.
*G06F 17/50* (2006.01)

(52) U.S. Cl.
CPC ........ *G06F 17/5081* (2013.01); *G06F 17/5045* (2013.01)
USPC ........... 716/112; 716/106; 716/108; 716/110; 716/111; 716/113; 716/134; 703/13; 703/14

(58) Field of Classification Search
CPC ..................... G06F 17/5081; G06F 17/5045
See application file for complete search history.

(56) References Cited

U.S. PATENT DOCUMENTS

| | | | |
|---|---|---|---|
| 7,785,946 B2 * | 8/2010 | Haffner et al. | 438/183 |
| 7,979,829 B2 * | 7/2011 | Smayling | 716/119 |
| 8,024,675 B1 * | 9/2011 | Gupta et al. | 716/54 |
| 8,060,843 B2 * | 11/2011 | Wang et al. | 716/55 |
| 8,296,689 B1 * | 10/2012 | Rahman et al. | 716/55 |
| 8,359,554 B2 * | 1/2013 | Wang et al. | 716/52 |
| 2010/0276759 A1 * | 11/2010 | Haffner et al. | 257/368 |
| 2011/0088008 A1 * | 4/2011 | Fifield et al. | 716/136 |
| 2011/0185323 A1 * | 7/2011 | Hogan et al. | 716/52 |
| 2013/0227501 A1 * | 8/2013 | Yang et al. | 716/102 |

* cited by examiner

*Primary Examiner* — A. M. Thompson
(74) *Attorney, Agent, or Firm* — Ditthavong & Steiner, P.C.

(57) ABSTRACT

An approach for methodology enabling a verification of IC designs that compensates for degraded performance due to a physical placement, particularly a stacked physical placement is disclosed. A set of stacked devices from a plurality of devices in an IC design is determined. One or more instance parameters indicating a physical placement of a device in the set is determined. A compensation metric indicating one or more electrical characteristics of a device in the set is determined based on the one or more instance parameters.

20 Claims, 4 Drawing Sheets

METHOD FOR SELECTIVELY MODELING NARROW-WIDTH STACKED DEVICE PERFORMANCE

TECHNICAL FIELD

The present disclosure relates to generating a computer simulation modeling electrical characteristics of integrated circuit (IC) designs. The present disclosure is particularly applicable to IC designs in 28 nanometer (nm) technology nodes and beyond utilizing stacked devices.

BACKGROUND

In IC designs, computer simulation processes are used to check integrity of the design and predict behavior of a resulting circuit. However, traditional computer simulation processes fail to capture a significant degradation in performance due to a physical placement of devices in the IC design, particularly with respect to stacked devices. As such, IC designs verified using traditional computer simulation processes may, nonetheless, contain unknown and significant degraded performance that impacts the manufacturing yield of a resulting IC circuit.

A need therefore exists for methodology enabling a verification of IC designs that compensates for degraded performance due to a physical placement, particularly a stacked physical placement.

SUMMARY

An aspect of the present disclosure is a method of compensating for physical placement of a device within a stack of devices.

Another aspect of the present disclosure is a system for compensating for physical placement of a device within a stack of devices.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a set of stacked devices from a plurality of devices in an IC design; determining one or more instance parameters indicating a physical placement of a device in the set; and determining a compensation metric indicating one or more electrical characteristics of a device in the set based on the one or more instance parameters.

Aspects include determining a proximity of a device in the IC from another device in the IC, and determining the set based on the determined proximity. Further aspects include determining a number of contacts for a device in the IC, and determining the set based on the determined number of contacts. Additional aspects include determining a gate connection for a device in the IC, and determining the set based on the determined gate connection. Some aspects include determining a number of devices in the set, wherein the one or more instance parameters are determined based on the determined number of devices. Further aspects include determining a device type and width for each device of the set, and determining the compensation metric based on the determined device types and widths. Additional aspects include a method, wherein the compensation metric indicates a threshold voltage, electron mobility, or a combination thereof of a device of the set. Some aspects include generating a netlist based on the compensation metric, wherein the netlist is configured for a base model unaware that the devices in the set are stacked. Further aspects include a method, wherein using the netlist based on the compensation metric, the base model compensates for performance differences of the IC associated with the one or more electrical characteristics, which performance differences the base model does not compensate for when using a netlist generated without the compensation metric.

Another aspect of the present disclosure is a system having a first module configured to: determine a physical spacing of a plurality of devices in an IC; generate one or more instance parameters identifying a stack of two or more of the devices based on the determined physical spacing; and generate a netlist for the IC; a second module configured to determine a compensation metric based on the one or more instance parameters, wherein the netlist is based, at least in part, on the compensation metric; and a third module, unaware of the physical spacing, configured to determine a performance of the IC based on the netlist.

Aspects include a system, wherein the one or more instance parameters indicate a number of devices in the stack and/or a position of each device in the stack. Additional aspects include a system, wherein the compensation metric indicates one or more electrical characteristics of a device in the stack based on a device type of each device in the stack and/or a width of each device in the stack. Further aspects include a system, wherein the compensation metric indicates a threshold voltage, electron mobility, or a combination thereof of a device in the stack. Some aspects include a system, wherein the third module is associated with a base model unaware of the devices being stacked. Additional aspects include a system, wherein using the netlist generated by the first module, the base model compensates for performance differences of the IC associated with the one or more electrical characteristics, which performance differences the base model does not compensate for when using a netlist generated without the compensation metric. Further aspects include a system, wherein the first module is associated with a layout and schematic of the IC, the second module is associated with a stress model of the layout and schematic, and the third module is associated with an electronic circuit simulator.

Another aspect of the present disclosure is a method including: determining, by a first module, a physical placement of a plurality of devices in an IC; designating, by the first module, two or more of the devices as a stack of devices based on the physical placement; generating, by the first module, one or more instance parameters indicating the physical placement of devices in the stack; determining, by a second module, a compensation metric indicating one or more electrical characteristics of a device in the stack based on the one or more instance parameters; generating, by the first module, a netlist of the IC based, at least in part, on the compensation metric; and determining, by a third module, a performance of the IC based on the netlist, the third module being unaware of the physical placement.

Some aspects include determining, by the first module, a proximity of the devices to each other; determining, by the first module, a number of contacts on each of the devices; and determining, by the first module, one or more gate connections on each of the devices, wherein the two or more devices are designated as a stack based on the determined proximity, number of contacts, gate connections, or a combination thereof. Further aspects include determining, by the first module, a number of devices in the stack and a position for each of the devices in the stack, wherein the one or more instance parameters indicates the determined number and/or the position. Additional aspects include a method, wherein the compensation metric indicates a threshold voltage, electron mobility, or a combination thereof for each of the devices in the stack based on a device type, and width for each of the devices in the stack.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

As noted above, a physical spacing of devices in an IC design may cause significant degradation of performance in a resulting circuit. For example, a circuit fabricated using 28 nm technology nodes with minimum width (e.g., 70 nm) stacked PMOS devices was determined to have a 50% performance gap compared to results from a traditional electronic simulation model. Such a performance gap is due to a combination of various process elements associated with fabrication such as doping and embedded silicon germanium (e-SiGe) profile, increased threshold voltage, source-drain diffusion resistance, and reduced mobility of the device. Additionally, the increase in threshold voltage also worsens due to a body bias effect of the device. As such, stacked devices, which are susceptible to the body bias effect, have a more pronounced degradation in performance. Further, increases in the source-drain diffusion resistance also contribute additional body bias, causing even more pronounced degradation in performance. However, since the problem affects selected devices (e.g., stacked devices), increasing the threshold voltage or degrading the mobility for all devices (e.g., in a base model) is not feasible. Similarly, increasing a source-drain diffusion resistance in a parasitic extraction (PEX) module will also affect all devices.

The present disclosure addresses and solves the current problem of accounting for degraded performance in select devices, for instance stacked devices, attendant upon verifying IC designs. The present disclosure addresses and solves such problems, for instance, by, inter alia, determining a compensation metric for select (e.g., stacked) devices based, for example, on placement in the stack.

Methodology in accordance with embodiments of the present disclosure includes: determining a set of stacked devices from a plurality of devices in an IC design; determining one or more instance parameters indicating a physical placement of a device in the set; and determining a compensation metric indicating one or more electrical characteristics of a device in the set based on the one or more instance parameters.

Figure 1:
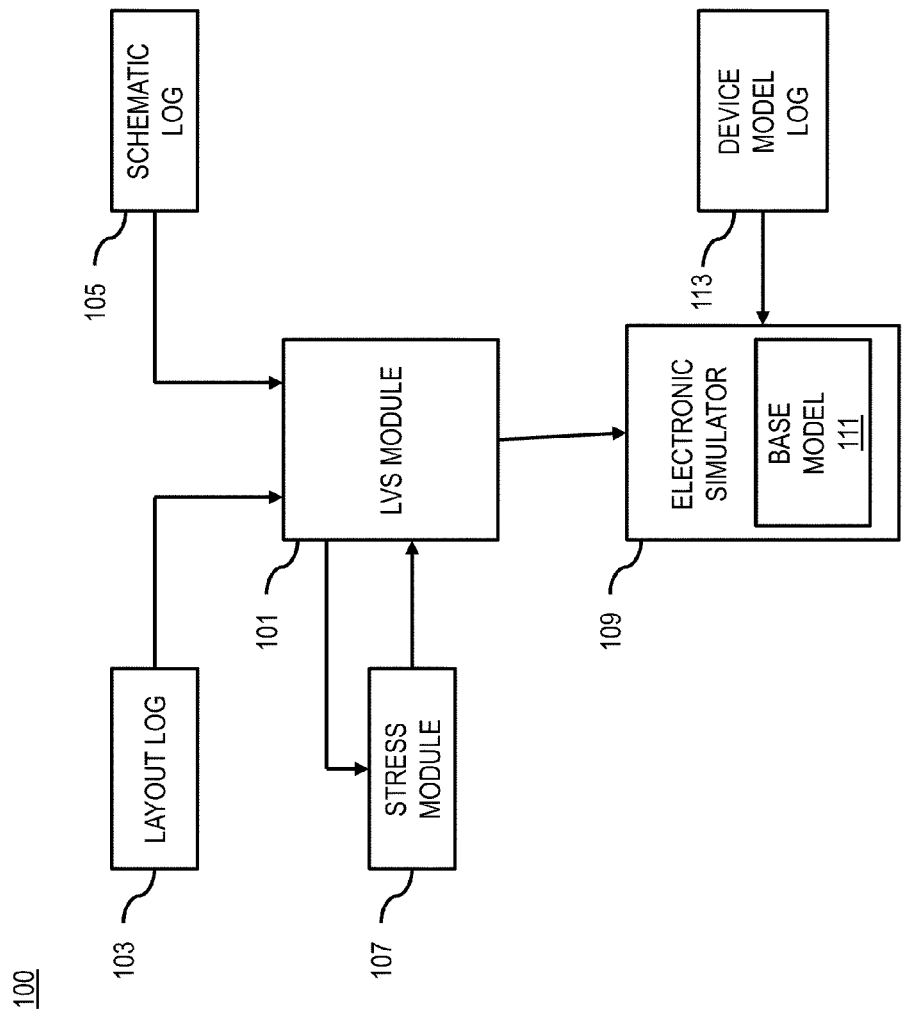
FIG. 1 is a diagram of modules configured to compensate for degraded performance due to a physical placement, in accordance with an exemplary embodiment.

Adverting to FIG. 1, a system 100 includes layout vs. schematic module (LVS) 101 having access to layout log 103 and schematic log 105, a stress module 107, and electronic simulator 109 having a base model 111 and access to device model log 113. Modules 101 and 107 and logs 103 and 105 may be combined. Alternatively, modules 101 and 107, simulator 109, and logs 103, 105, and 113 may be combined.

LVS module 101 is configured to verify that a physical layout for an IC design, retrieved from layout log 103, performs a function indicated by a corresponding schematic for the layout, retrieved from schematic log 105. For instance, the LVS module 101 may determine that a physical layout contains shorts, open connections, device mismatches, and the like, that prevent a fabrication of the layout from performing identically to a corresponding schematic. Additionally, the LVS module 101 may determine one or more instance parameters indicating, for example, a physical placement of devices. Further, the LVS module 101 may determine whether devices in a layout (e.g., from layout log 103) are stacked. The LVS module 101 may create a netlist describing the connectivity of an electronic design indicated in a layout and corresponding schematic.

Stress module 107 is configured to generate a compensation metric. For example, the stress module 107 receives an instance parameter from LVS module 101 indicating a physical spacing of devices, and the stress module 107 determines additional mobility and threshold voltage degradation for each of the devices. The stress module 107 may be part of LVS module 101.

Electronic simulator 109 verifies electrical performance of the IC design, and predicts IC behavior. For example, the simulator 109 models operation of a circuit defined by a netlist (from LVS module 101) indicating devices and connections between devices. Additionally, device models may be defined by device model log 113. As illustrated, simulator 109 utilizes a base model 111 (e.g., BSIM4, PSP).

Figure 2:
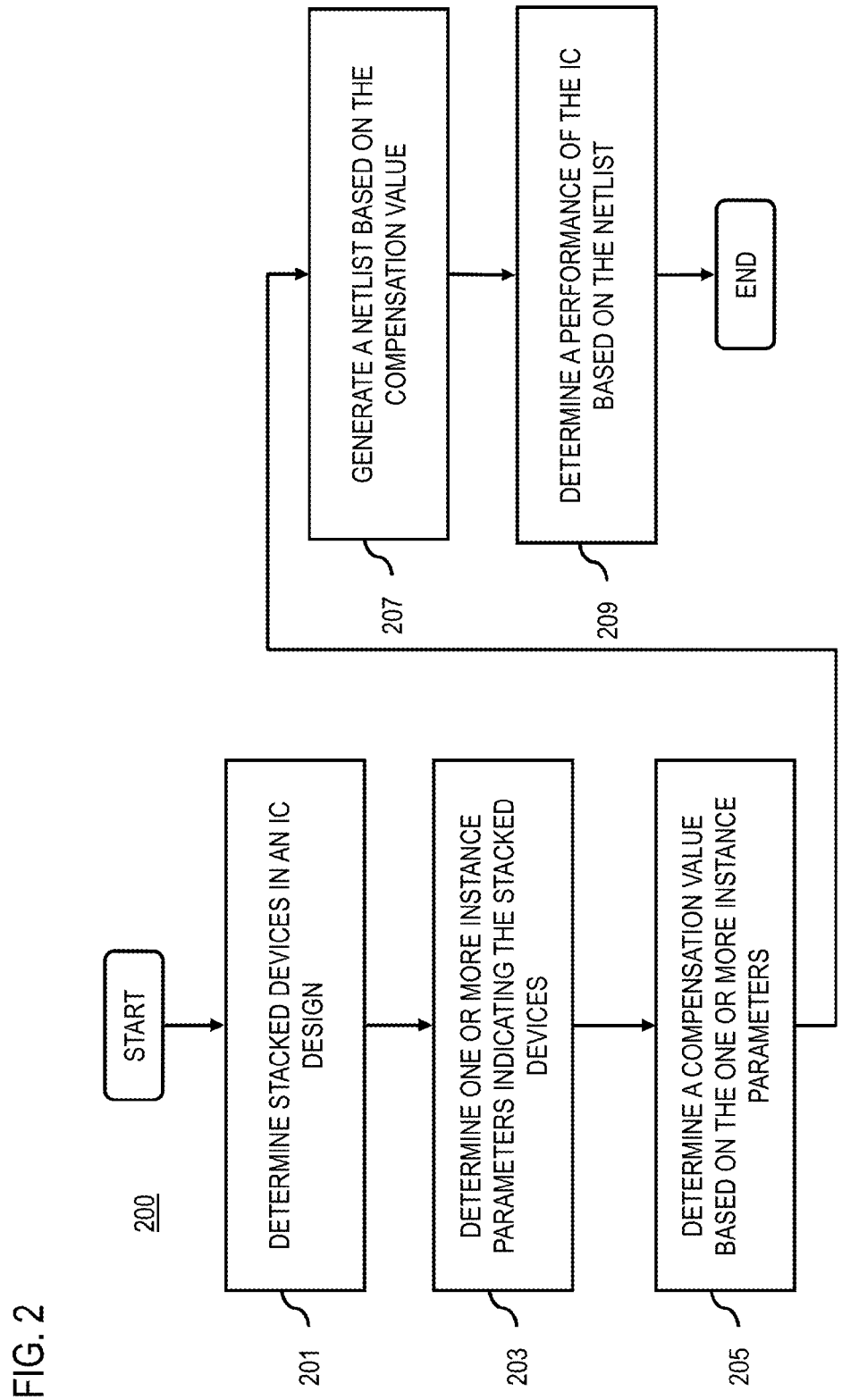
FIG. 2 is a flowchart of a process for compensating for degraded performance due to a physical placement, according to an exemplary embodiment.
Figure 4:
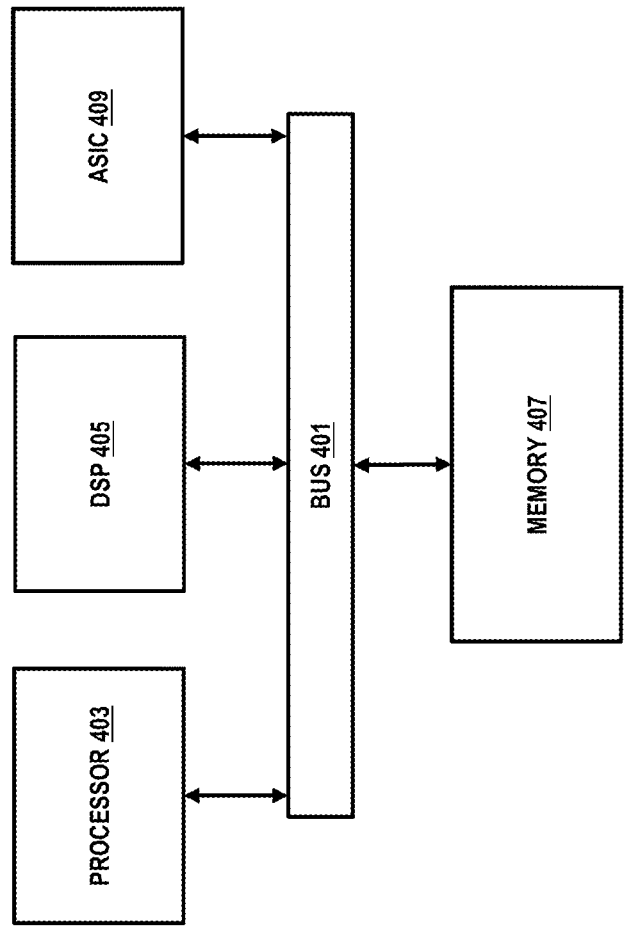
FIG. 4 is a diagram of a chip set that can be used to implement exemplary embodiments.

FIG. 2 is a flowchart of a process 200 for compensating for degraded performance due to a physical placement, according to an exemplary embodiment. By way of example, process 200 is explained with respect to system 100 of FIG. 1. Also, process 200 may be implemented in, for instance, a chip set including a processor and a memory as shown in FIG. 4.

In step 201, the LVS module 101 determines stacked devices in an IC design. For example, the LVS module 101 determines devices to be stacked when adjacent (and/or within a predefined distance from each other). Additionally, the LVS module 101 may determine devices to be stacked based on a number of contacts. For example, the LVS module 101 determines devices with no contacts placed in a physical layout to be stacked. In addition, the LVS module 101 may determine devices having no gate connectivity to be stacked. Further, the LVS module 101 may select devices (e.g., determine devices to be stacked) based on device characteristics and/or device types. For instance, adjacent devices having no contacts or gate connectivity may be excluded from the subsequent steps (e.g., steps 203-209) when the device widths exceed a predefined value (e.g., 350 nm). In another example, a device that is not adjacent having multiple contacts and gate connectivity is selected (e.g., determined to be stacked) when the device has a width below a predefined value (e.g., 300 nm).

The LVS module 101 then determines, as in step 203, one or more instance parameters indicating the stacked devices. The one or more instance parameters may include a number of fingers and/or a position of each finger. The one or more instance parameters may be determined for all stacked devices or some stacked devices. For instance, one or more instance parameters may be determined for one or more types of devices (e.g., PMOS and/or NMOS) and/or devices having a width below a predefined value (e.g., 100 nm). Table 1 illustrates an exemplary set of instance parameters indicating a number of fingers and a position of each finger in a stack with a corresponding device type and width of each of the fingers for three stacked devices. The LVS module 101 may then initiate a sending of the instance parameters to the stress module 107 (and the device type and/or width).

TABLE 1

| Number of Fingers | Position of each finger | Device Type | Width (nm) |
|---|---|---|---|
| 3 | 1 | PMOS | 300 |
| 3 | 2 | PMOS | 150 |
| 3 | 3 | NMOS | 500 |

The stress module 107 then determines, as in step 205, a compensation metric based on the one or more instance parameters (and the device type and/or width). For example, stress module 107 may determine a threshold voltage adder of +10 millivolts (mV) and a mobility multiplier of 0.98 for instance parameters (received from LVS module 101) indicating a stack of identical PMOS devices having 2 fingers. The compensation metric may be different for each finger. The stress module 107 may return the compensation metric (e.g., threshold voltage adder and a mobility multiplier) to the LVS module 101.

The LVS module 101 generates, as in step 207, a netlist based on the compensation metric. For example, LVS module 101 includes the threshold voltage adder and mobility multiplier (received from stress module 107) for each finger of stacked devices in a netlist. The netlist may additionally be generated from a layout (from layout log 103) and/or schematic (from schematic log 105). The LVS module 101 may provide the netlist (including the threshold voltage adder and mobility multiplier) to the simulator 109.

The simulator 109 determines, as in step 209, a performance of the IC based on the netlist. For example, simulator 109 predicts behavior of a fabricated circuit design indicated by the netlist (received from LVS module 101). As noted above, the netlist may include compensation metrics, resulting in a verification of IC designs that compensates for degraded performance due to a stacking of devices. Further, the above compensation for degraded performance due to a physical placement may be transparent to the simulator 109. As such, base model 111 of simulator 109 may compensate for performance differences, of an IC, associated with one or more electrical characteristics using the generated netlist, but the base model 111 would not compensate for those performance differences using a netlist generated without the compensation metric. For example, a netlist may be configured to indicate threshold voltage adders and mobility multipliers without the one or more instance parameters. As such, netlists configured to compensate for degraded performance due to a physical placement may be utilized by traditional base models (e.g., BSIM4) and/or traditional electronic simulation programs (e.g., SPECTRE, HSPICE).

Figure 3:
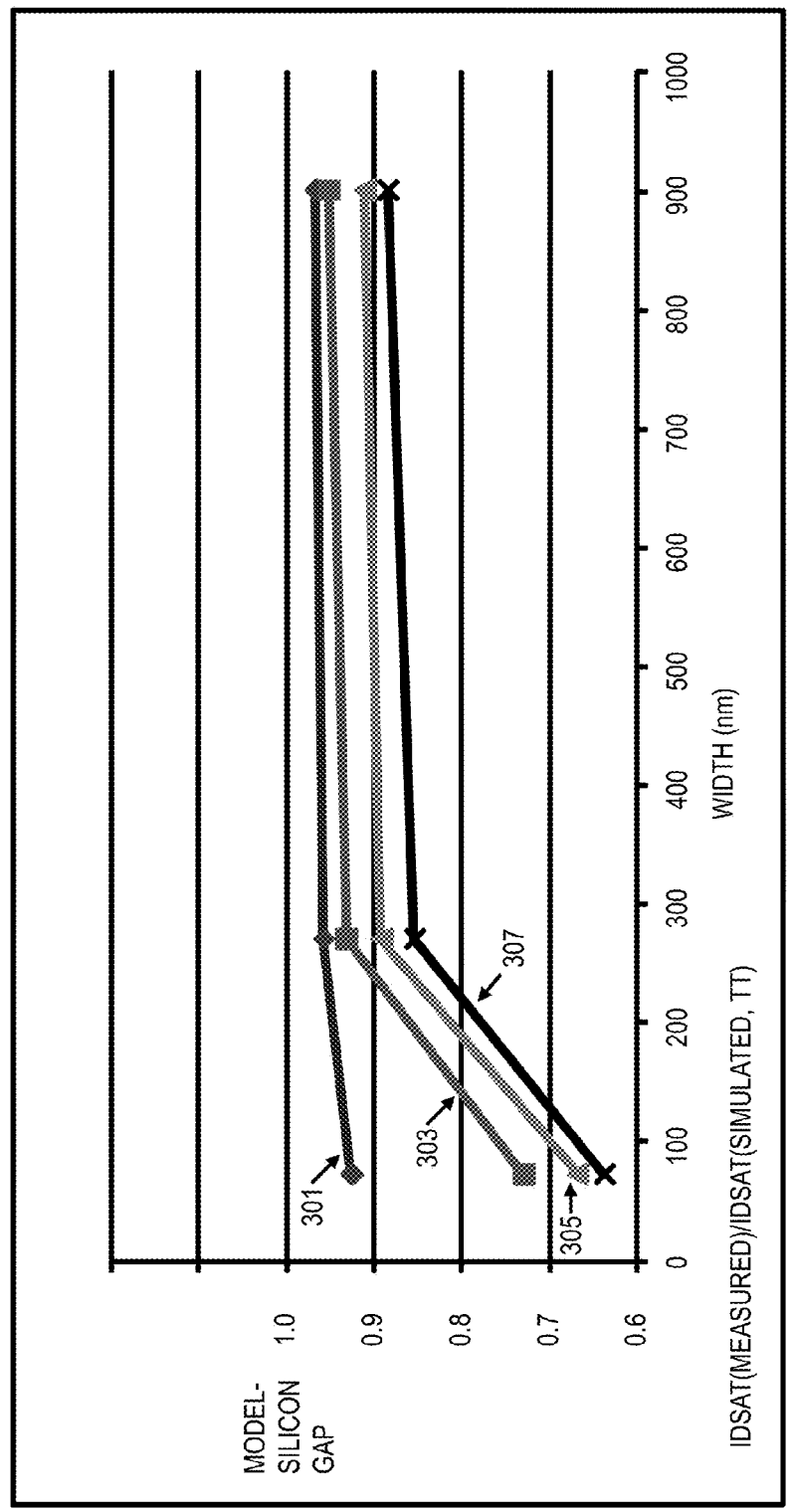
FIG. 3 illustrates degraded performance of stacked devices, in accordance with an exemplary embodiment.

FIG. 3 illustrates degraded performance of stacked devices, in accordance with an exemplary embodiment. Results 301, 303, 305, and 307 indicate a model-silicon gap (e.g., measured over simulated) using traditional methods for an unstacked device, a stack of two devices, a stack of three devices, and a stack of 4 devices, respectively. As shown, the model-silicon gap for stacked devices differs more from unstacked devices as the number of stacked devices increases. Additionally, the model-silicon gap varies more with a decreasing device width for stacked and unstacked devices. However, methods described with respect to FIGS. 1 and 2, enable simulated results to reduce or eliminate the illustrated reduction in model accuracy for stacked (and particularly for small width) devices. For instance, compensation metrics may be selected such that the model-silicon gaps are (nearly) constant between devices having different widths, between an unstacked device and stacked devices, between differing numbers of stacked devices (e.g., 2, 3, or 4), or a combination thereof.

FIG. 4 is a diagram of a chip set that can be used to implement various exemplary embodiments. Chip set 400 is programmed to provide compensating for degraded performance due to a physical placement as described herein and includes, for instance, the processor and memory components described with respect to FIG. 4 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 400, or a portion thereof, constitutes a means for performing one or more steps of FIG. 2.

The chip set 400 may include a communication mechanism such as a bus 401 for passing information among the components of the chip set 400. A processor 403 has connectivity to the bus 401 to execute instructions and process information stored in, for example, a memory 407. The processor 403 may include one or more processing cores with each core configured to perform independently. A multi-core processor enables multiprocessing within a single physical package. Examples of a multi-core processor include two, four, eight, or greater numbers of processing cores. Alternatively or in addition, the processor 403 may include one or more microprocessors configured in tandem via the bus 401 to enable independent execution of instructions, pipelining, and multithreading. The processor 403 may also be accompanied by one or more specialized components to perform certain processing functions and tasks such as one or more digital signal processors (DSP) 405, or one or more application-specific integrated circuits (ASIC) 409. A DSP 405 typically is configured to process real-world signals (e.g., sound) in real time independently of the processor 403. Similarly, an ASIC 409 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 403 and accompanying components have connectivity to the memory 407 via the bus 401. The memory 407 includes both dynamic memory (e.g., RAM, magnetic disk, writable optical disk, etc.) and static memory (e.g., ROM, CD-ROM, etc.) for storing executable instructions that when executed perform the inventive steps described herein. The memory 407 also stores the data associated with or generated by the execution of the inventive steps. Processor 403, together with memory 407, constitutes the structure that performs the functions of the LVS module 101, the stress module 107, and the electronic simulator 109 illustrated in FIG. 1.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

The embodiments of the present disclosure can achieve several technical effects, including electronic computer simulations capable of compensating for degraded performance attendant upon an IC design due, for instance, to a physical spacing of devices in the IC design. The present disclosure enjoys industrial applicability in any of electronic computer simulation of highly integrated semiconductor devices, including logic or high voltage technology nodes from mainstream to advanced devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

The invention claimed is:

1. A method of modeling comprising:
   determining a set of stacked devices from a plurality of devices in a physical layout of for an integrated circuit (IC) design, wherein a device in the set is associated with one or more electrical performance characteristics;
   determining one or more instance parameters indicating a physical placement of the device in the set;
   determining, by a processor, a compensation metric indicative of a degraded electrical performance of the device in the set and indicating a modification to the one or more electrical performance characteristics associated with the device in the set based on the one or more instance parameters;
   generating a netlist based on the compensation metric; and
   determining a performance of the IC design based on the netlist.

2. The method according to claim 1, comprising:
   determining a proximity of a device in the IC design from another device in the IC design, and determining the set based on the determined proximity.

3. The method according to claim 2, further comprising:
   determining a number of contacts for a device in the IC design, and determining the set based on the determined number of contacts.

4. The method according to claim 3, further comprising:
   determining a gate connection for a device in the IC design, and determining the set based on the determined gate connection.

5. The method according to claim 1, comprising:
   determining a number of devices in the set, wherein the compensation metric is determined based on the determined number of devices.

6. The method according to claim 1, comprising:
   determining a device type and width for each device of the set, wherein the compensation metric is based on the determined device types and widths.

7. The method according to claim 1, wherein the compensation metric indicates at least one of a threshold voltage and electron mobility of a device of the set.

8. The method according to claim 1,
   wherein the netlist is configured for a base model.

9. The method according to claim 8, wherein the base model compensates for performance differences of the IC design associated with the one or more electrical performance characteristics when using the netlist generated based on the compensation metric, and the base model does not compensate for performance differences of the IC design associated with the one or more electrical characteristics when using a netlist generated without the compensation metric.

10. A system for modeling comprising:
    a first module configured to:
    determine a physical spacing of a plurality of devices in an integrated circuit (IC);
    generate one or more instance parameters identifying a stack of two or more of the devices based on the determined physical spacing; and
    generate a netlist for the IC;
    a second module configured to determine a compensation metric indicating at least one of an adder and a multiplier for one or more electrical characteristics of at least one device of the two or more of the devices based on the one or more instance parameters, wherein the netlist is based, at least in part, on the compensation metric; and
    a third module, unaware of the physical spacing, configured to determine a performance of the IC based on the netlist.

11. The system according to claim 10, wherein the one or more instance parameters indicate at least one of a number of devices in the stack and a position of each device in the stack.

12. The system according to claim 11, wherein the compensation metric indicates one or more electrical characteristics of a device in the stack based on at least one of a device type of each device in the stack and a width of each device in the stack.

13. The system according to claim 12, wherein the compensation metric indicates at least one of a threshold voltage and an electron mobility of a device in the stack.

14. The system according to claim 12, wherein the third module is associated with a base model.

15. The system according to claim 14, wherein the base model compensates for performance differences of the IC associated with the one or more electrical characteristics when using the netlist generated based on the compensation metric, and the base model does not compensate for performance differences of the IC associated with the one or more electrical characteristics when using a netlist generated without the compensation metric.

16. The system according to claim 10, wherein the first module is associated with a layout and schematic of the IC, the second module is associated with a stress module of the layout and schematic, and the third module is associated with an electronic circuit simulator.

17. A method of modeling comprising:
   determining, by a first module, a physical placement of a plurality of devices in an integrated circuit (IC);
   designating, by the first module, two or more of the devices as a stack of devices based on the physical placement;
   generating, by the first module, one or more instance parameters indicating the physical placement of devices in the stack;
   determining, by a second module, a compensation metric indicating one or more electrical characteristics of a device in the stack based on the one or more instance parameters, the compensation metric indicating a degraded electrical performance of the device in the stack;
   generating, by the first module, a netlist of the IC based, at least in part, on the compensation metric; and
   determining, by a third module, a performance of the IC based on the netlist, the third module being unaware of the physical placement.

18. The method according to claim 17, further comprising:
   determining, by the first module, a proximity of the devices to each other;
   determining, by the first module, a number of contacts on each of the devices; and
   determining, by the first module, one or more gate connections on each of the devices, wherein the two or more devices are designated as a stack based on at least one of the determined proximity, number of contacts and gate connections.

19. The method according to claim 18, further comprising:
   determining, by the first module, a number of devices in the stack and a position for each of the devices in the stack, wherein the one or more instance parameters indicates at least one of the determined number and the position.

20. The method according to claim 18, wherein the compensation metric indicates at least one of a threshold voltage and electron mobility for each of the devices in the stack based on a device type, and width for each of the devices in the stack.

* * * * *